United States Patent [19]
Maeta et al.

[11] Patent Number: 5,677,246
[45] Date of Patent: Oct. 14, 1997

[54] METHOD OF MANUFACTURING SEMICONDUCTOR DEVICES

[75] Inventors: Hideaki Maeta; Katsuhiko Oyama; Hiroshi Iwasaki; Yumiko Ohshima; Takahito Nakazawa, all of Yokohama, Japan

[73] Assignee: Kabushiki Kaisha Toshiba, Kawasaki, Japan

[21] Appl. No.: 575,046

[22] Filed: Nov. 28, 1995

[30] Foreign Application Priority Data

Nov. 29, 1994 [JP] Japan .................................. 6-295230
Nov. 29, 1994 [JP] Japan .................................. 6-295231
Nov. 29, 1994 [JP] Japan .................................. 6-295233

[51] Int. Cl.⁶ .................................................. H01L 21/60
[52] U.S. Cl. .................... 437/209; 437/211; 437/214; 437/217
[58] Field of Search ............................ 437/209, 211, 437/214, 215, 217, 218, 219, 220

[56] References Cited

U.S. PATENT DOCUMENTS

| | | | |
|---|---|---|---|
| 4,432,131 | 2/1984 | Sadamasa et al. | 437/211 |
| 5,252,519 | 10/1993 | Nakatani et al. | 437/209 |
| 5,292,688 | 3/1994 | Hsiao et al. | 437/211 |
| 5,436,913 | 7/1995 | Yamamura et al. | 371/21.2 |
| 5,471,027 | 11/1995 | Call et al. | 437/211 |
| 5,496,769 | 3/1996 | Marion et al. | 437/211 |
| 5,578,527 | 11/1996 | Chang et al. | 437/209 |
| 5,579,573 | 12/1996 | Baker et al. | 437/211 |

FOREIGN PATENT DOCUMENTS

| | | |
|---|---|---|
| 2-7180 | 1/1990 | Japan . |
| 7-226455 | 8/1995 | Japan . |
| 7-245360 | 9/1995 | Japan . |
| 7-273244 | 10/1995 | Japan . |

*Primary Examiner*—Kevin Picardat
*Attorney, Agent, or Firm*—Finnegan, Henderson, Farabow, Garrett & Dunner, L.L.P.

[57] ABSTRACT

In the disclosed method of manufacturing semiconductor devices with a single-sided resin-sealed package structure, when resin is filled into between the chip and the substrate, the occurrence of variations in the finishing dimensions of the package or defects in the outward appearance of the package is prevented. The disclosed manufacturing method comprises the step of using a guide plate for pouring resin and bringing one end of the guide plate into contact with one face end of a substrate or with a portion of one major surface near at least one side face of a chip in filling sealing resin between the chip and the substrate after the semiconductor chip has been mounted, with the face down, on one major surface of a wiring substrate having the wiring containing a connection section, the step of inclining the guide plate so that the guide plate may meet one major surface of the substrate at a specified angle, when or after one end of the guide plate is brought into contact with the substrate, and the step of supplying the resin to the opening between the chip and the substrate by supplying the resin onto the top surface of the guide plate and allowing the resin to flow over the top surface of the guide plate.

22 Claims, 6 Drawing Sheets

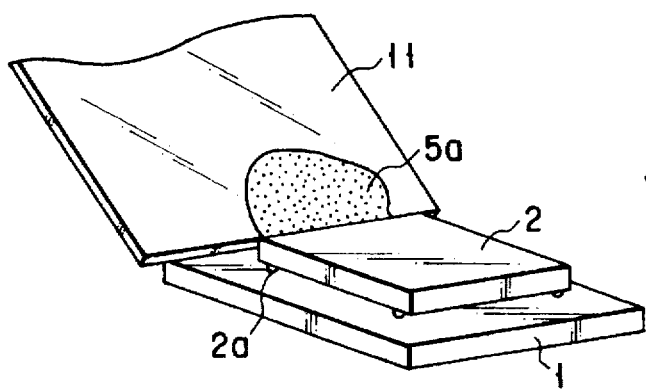
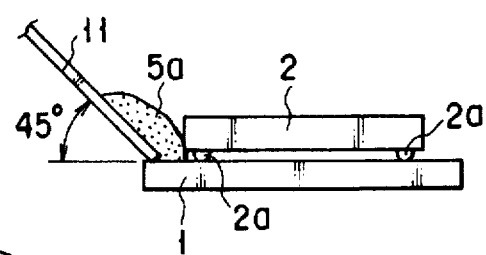
FIG. 1A          FIG. 1B
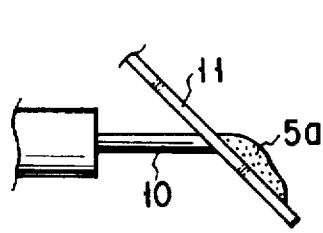
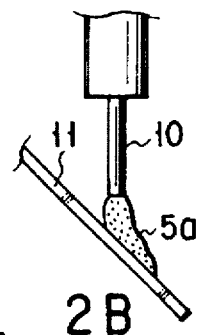
FIG. 2A          FIG. 2B
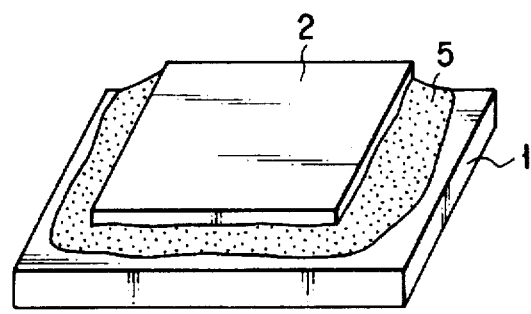
FIG. 3A
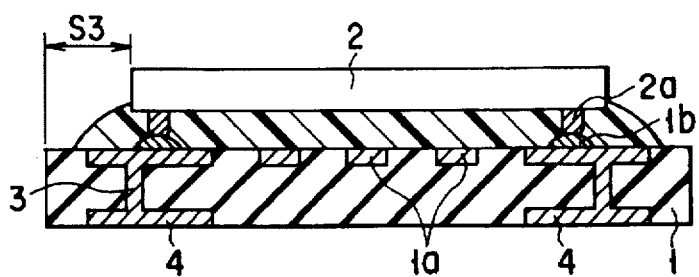
FIG. 3B

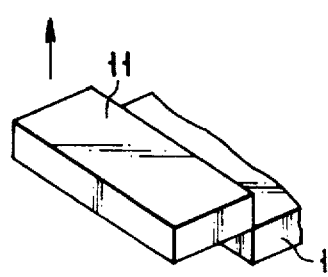
F I G. 8
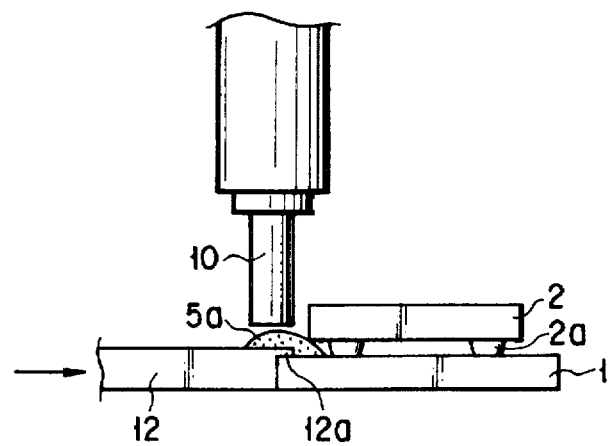
F I G. 9
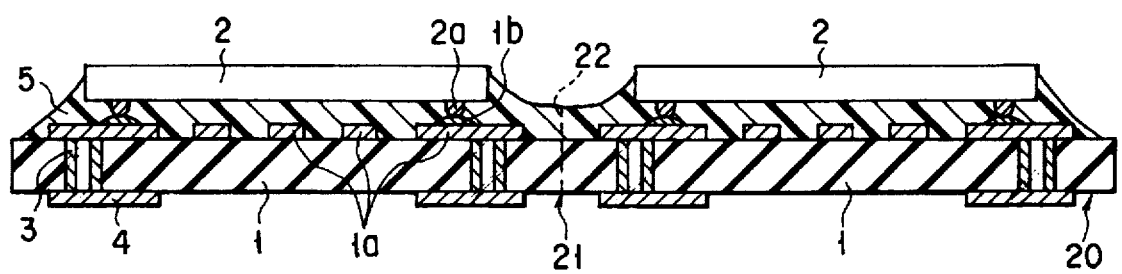
F I G. 10A
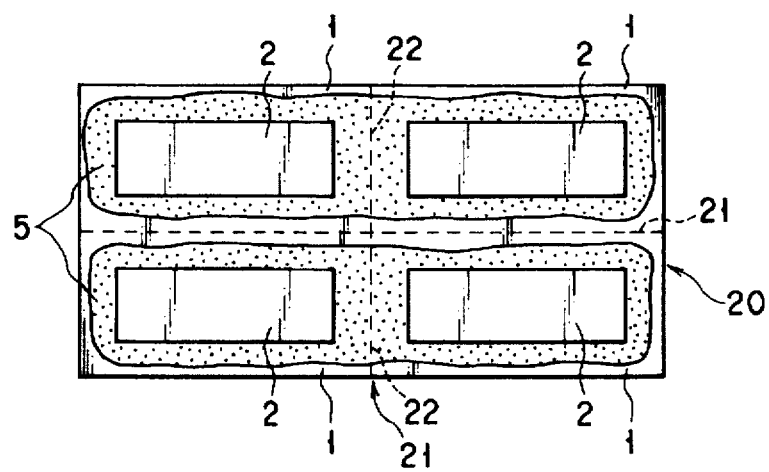
F I G. 10B

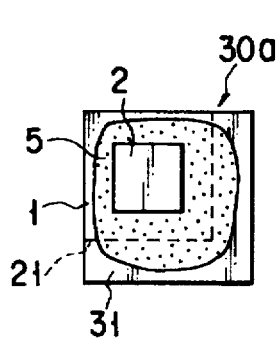
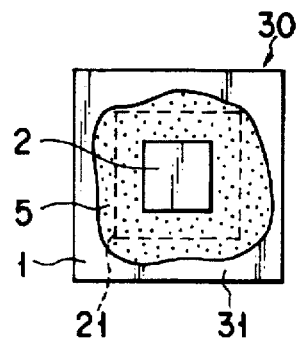
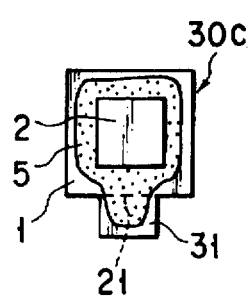
FIG. 14A   FIG. 14B   FIG. 14C
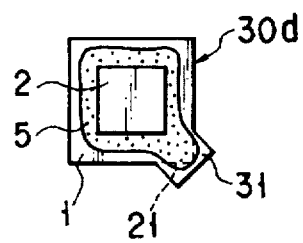
FIG. 14D
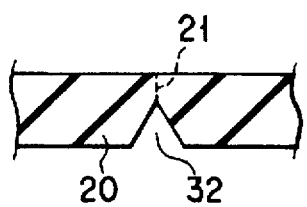
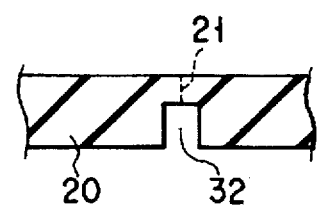
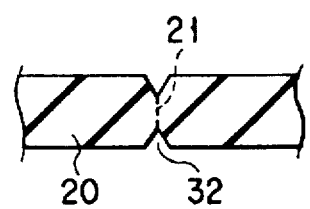
FIG. 15A   FIG. 15B   FIG. 15C
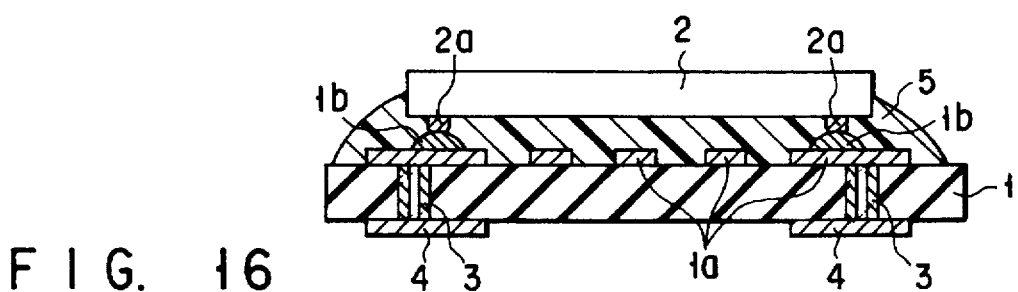
FIG. 16
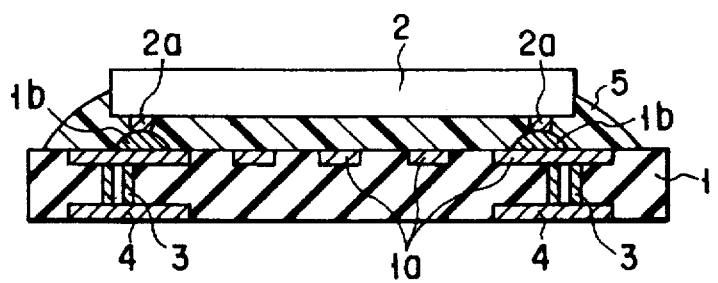
FIG. 17

METHOD OF MANUFACTURING SEMICONDUCTOR DEVICES

BACKGROUND OF THE INVENTION

1. Field of the Invention

This invention relates to a semiconductor device and a method of manufacturing the semiconductor device, and more particularly to a semiconductor device with a single-sided resin-sealed package structure and a method of forming a chip-sealing resin layer.

2. Description of the Related Art

There have been demands that the packages of semiconductor devices used in, for example, integrated-circuit cards, game mask ROM cards, or compact portable telephones, should be made smaller and thinner. To meet these demands, the techniques for mounting bare semiconductor chips have been developed and some of them are known as chip-on-board (COB) mounting and flip-chip mounting.

The flip-chip mounting is such that the metal bump electrodes on the bare chip element forming surface are pressed against the electrode pad formed at one major surface of the wiring substrate, thereby connecting them (or effecting flip chip bonding). The mounting is superior in packaging density to COB mounting that needs wire bonding, but has the problem of impairing the reliability of connection because there is a possibility that the stress resulting from the thermal expansion of the substrate will act on the connecting section between the substrate and the chip and give damage to the connection.

A single-sided resin-sealed package structure that mechanically fixes a substrate and a chip with resin intervening between the bare chip and the substrate, has been disclosed as an improved example of the flip-chip mounting, as disclosed in, for example, Jpn. Pat. Appln. KOKAI Publication No. 2-7180.

Furthermore, various improved examples of the single-sided resin-sealed package structure and their manufacturing methods have been disclosed in Japanese Patent Application No. 6-32296, Japanese Patent Application No. 6-50757, and Japanese Patent Application No. 6-60493, which have been assigned to the applicant of the present invention.

FIG. 16 shows an example of the single-sided resin-sealed package structure disclosed in Japanese Patent Application No. 6-50757.

The package structure comprises a wiring substrate 1 having the wiring 1a containing a connection section (e.g., a connecting pad 1b) on one major surface, a semiconductor chip 2 mounted with the face down on one major surface of the substrate, a resin layer 5 filled between the chip and the wiring substrate, and an external connection terminal drawn to and exposed at the other major surface of the substrate and electrically connected to the chip. In FIG. 16, reference symbol 2a indicates a bump electrode, and 3 represents a contact conducting wiring formed in a through-hole made in the substrate 1. The bump electrode 2 is connected to the connection pad 1 and the wiring 1a is connected to the external connection terminal 4 via the contact conducting wiring 3 formed in the through-hole.

FIG. 17 shows an example of the single-sided resin-sealed package structure disclosed in Japanese Patent Application No. 6-60493.

The package structure is an improved example of the package structure of FIG. 16, where the wiring 1a is embedded in one main surface region of the substrate 1 so as to be almost flush with the major surface of the substrate 1 (bumps must be within about ±10 μm in height). In FIG. 17, the same parts as those in FIG. 16 are indicted by the same reference symbols.

With the package structure, when resin is poured into between the chip and the substrate by capillary action, because resin flows in easily because the evenness between the chip and the substrate is high, so that a close resin layer without voids can be formed and consequently the reliability of the fixing between the chip and the substrate can be increased.

To form the resin layer 5 in FIGS. 16 and 17, resin 5a is supplied from the nozzle (needle) 71 of a resin supplying unit (dispenser) onto one side of the substrate 1 as shown in FIG. 18A and poured into between the chip and the substrate by capillary action. After the resin has filled the gap between them, it is hardened. Since the chip itself is made of a close, sturdy material (e.g., silicon), the exposed top surface of the chip 2 has few reliability problems even if resin sealing is not effected.

Since the semiconductor devices with the above-described package structure can undergo a burn-in test to apply temperature stress and/or electric-field stress after resin sealing, they are superior to the semiconductor devices by flip-chip mounting without resin sealing.

In the above method of filling resin, however, as shown in FIG. 18B, the extrusion width S2 of the resin at one side of the resin supplying side on the substrate is much greater than the extrusion width (about 0.25 mm) S1 of the resin sticking out to one side opposite to one side of the resin supplying side on the substrate. Specifically, the extrusion width S2 at one side of the resin supplying side was 0.83 mm maximum when the supplied amount of resin was twice the volume between the chip and the substrate, 1.15 mm maximum when the supplied amount of resin was three times the volume, and 2.12 mm when the supplied amount of resin was four times the volume.

At one side opposite to one side of the resin supplying side, the extrusion width S1 of resin is almost determined by the physical properties of resin. At one side of the resin supplying side, the needle 71 is forced to approach the chip so as not to come into contact with the chip and then supplies resin, so that the extrusion width S2 is determined by the size of the needle (the currently used standard sizes have outside diameters of 0.82 mm and 1.25 mm) and is greater than the needle size.

With the above-described resin filling method, when an attempt is made to decrease the distance between the chip outer edge and the substrate outer edge (the allowable needle setting range or resin supplying space) S3, it is limited by the outside diameter of the needle 71. Specifically, when S3 is made smaller without taking into account the outside diameter of the needle, the resin spewed out from the needle can run onto the top surface of the chip or hang down from the end of the substrate, causing variations in the finishing dimensions of the package or a defect in the outward appearance of the package, with the result that the needle now in use cannot be used without changing its outside diameter. When an attempt is made to reduce the outside diameter of the needle, the inside diameter of the needle now in use (ranging from 0.6 to 0.7 mm) must be made smaller accordingly, with the result that when a resin with a high viscosity is used, the resin spewing from the needle is liable to clog the needle, making it difficult to spew out the resin from the needle.

When a resin with a relatively low viscosity is used, the resin is less liable to clog the needle even if the diameter of the needle is made smaller. In this case, however, the amount of resin spewed out at one time (the amount of resin supplied) is reduced, so that the number of times the dispenser spews out the resin must be increased to assure the necessary amount of resin to fill the gap between the chip and the substrate. This causes the problem of making it more difficult to control the number of times.

As there have been demands toward a smaller single-sided resin-sealed package structure, the distance between the chip outer edge and the substrate outer edge should be made less than, for example, 1 mm to 0.5 mm at each side of the substrate with a structure where the chip and the substrate of the almost chip size are put together by flip-chip bonding. The resin filling method as described above cannot meet the demands.

The problem with the method of filling resin between the chip and the substrate in manufacturing semiconductor devices with the aforementioned single-sided resin-sealed package structure, is that when the distance between the chip outer edge and the substrate outer edge becomes very small, this causes variations in the finishing dimensions of the package or a defect in the outward appearance of the package.

SUMMARY OF THE INVENTION

An object of the present invention is to provide a method of manufacturing semiconductor devices which, when resin is filled between a chip and a substrate to manufacture a semiconductor device with a single-sided resin-sealed package structure, can prevent the occurrence of variations in the finishing dimensions of the package or defects in the outward appearance of the package, even if the distance between the chip outer edge and the substrate outer edge is very small, and which can make smaller the single-sided resin-sealed package structure.

The foregoing object is accomplished by providing a method of manufacturing semiconductor devices, comprising: the step of positioning a semiconductor chip so that a connection section of a wiring substrate having the wiring containing the connection section on one major surface and an external connection terminal connected to the wiring via a contact conducting layer and formed on the other major surface faces an electrode terminal section of the corresponding semiconductor chip; the step of connecting the connection section of the wiring substrate to the electrode terminal section of the corresponding semiconductor chip; the step of thereafter filling a sealing resin between the semiconductor chip and the wiring substrate; and the step of hardening the filled sealing resin; and further comprising: the step of, when the sealing resin is filled, using a guide plate for pouring resin and bringing one end of the guide plate into contact with one face end of the wiring substrate or with a portion of one major surface near at least one side face of the chip; the step of inclining the guide plate so that the guide plate may cross one major surface of the wiring substrate at a specified angle, when or after one end of the guide plate is brought into contact with the wiring substrate; the step of thereafter supplying resin onto the top surface of the guide plate and allowing the resin to flow over the top surface of the guide plate, thereby supplying the resin to an opening between the chip and the substrate; and the step of thereafter separating the guide plate from the wiring substrate.

When resin is filled between the chip and the substrate in manufacturing semiconductor devices with a single-sided resin-sealed package structure, a guide plate for pouring resin is used and one end of the guide plate is brought into contact with a portion of one main surface of the wiring substrate near one side face of the chip at a specified angle. Thereafter, resin is supplied onto the top surface of the guide plate and allowed to flow over the top surface of the guide plate, thereby supplying the resin to the opening between the chip and the substrate. This makes it possible to pour and fill the resin into between the chip and the substrate by capillary action of resin between the chip and the substrate.

At this time, even if the distance between the chip outer edge and the substrate outer edge is very small, an almost constant amount of resin can be supplied stably and reliably to between the chip and the substrate, preventing the resin from running onto the top surface of the chip or hanging down from the end of the substrate. This helps to prevent the occurrence of variations in the finishing dimensions of the package or defects in the outer appearance of the package.

It is preferable that when the resin is supplied onto the top surface of the guide plate, a hole is made in the guide plate in advance, a plurality of grooves are made in the top surface of the guide plate so as to connect to the hole, an almost constant amount of resin is supplied through the hole from the reverse side of the guide plate, and the resin supplied through the hole is allowed to flow through the plurality of grooves.

It is preferable that the plurality of grooves are formed so that those on both sides may have the longer paths along which the resin flows toward the wiring substrate than the groove in the middle.

It is preferable that when the resin is supplied onto the top surface of the guide plate, a plurality of holes are made in the guide plate in advance, and an almost constant amount of resin is supplied through the plurality of holes from the reverse side of the guide plate.

It is preferable that the positions and shapes of the plurality of holes are determined so that those on both sides may have the longer paths along which the resin flows toward the wiring substrate than the hole in the middle.

Another object of the present invention is to provide a method of manufacturing semiconductor devices which, when resin is filled between a chip and a substrate in manufacturing semiconductor devices with a single-sided resin-sealed package structure, enables use of a conventional dispenser and a needle whose diameter corresponds to the properties of the resin used and can prevent the occurrence of variations in the finishing dimensions of the package or defects in the outward appearance of the package, regardless of the diameter of the needle, even if the distance between the chip outer edge and the substrate outer edge is very small, and which can make smaller the single-sided resin-sealed package structure.

The foregoing object is accomplished by providing a method of manufacturing semiconductor devices, comprising: the step of positioning a semiconductor chip so that a connection section of a wiring substrate having the wiring containing the connection section on one major surface and an external connection terminal connected to the wiring via a contact conducting layer and formed on the other major surface faces an electrode terminal section of the corresponding semiconductor chip; the step of connecting the connection section of the wiring substrate to the electrode terminal section of the corresponding semiconductor chip; the step of thereafter filling a sealing resin between the semiconductor chip and the wiring substrate; and the step of hardening the filled sealing resin; and further comprising: the step of, when the sealing resin is filled, using a guide plate for helping supply resin and bringing one end of the guide plate into close contact with at least one end of the wiring substrate so that the top surface of the guide plate is almost flush with one major surface of the wiring substrate; the step of thereafter supplying resin onto the top surface including the contact portions of the guide plate and wiring substrate and thereby supplying the resin to an opening between the chip and the substrate; and the step of thereafter separating the guide plate from the wiring substrate.

When resin is supplied between the chip and the substrate in manufacturing semiconductor devices with a single-sided resin-sealed package structure, a guide plate for helping supply resin is used and one end of the guide plate is brought into close contact with at least one end of the wiring substrate so that the top surface of the guide plate is almost flush with one major surface of the wiring substrate. Thereafter, resin is supplied onto the surface including the contact portions of the guide plate and wiring substrate, thereby supplying the resin to the opening between the chip and the substrate. This makes it possible to pour and fill the resin into between the chip and the substrate by capillary action of resin between the chip and the substrate. When the resin is supplied, it is desirable that the resin should be supplied so as to adhere to one side face of the chip to cause capillary action of resin to start immediately. Thereafter, the guide plate is separated from the wiring substrate.

With this method, even if the distance between the chip outer edge and the substrate outer edge is very small, a conventional dispenser and a needle whose diameter corresponds to the properties of the resin used can be used, an almost constant amount of resin can be supplied stably and reliably to between the chip and the substrate, regardless of the diameter of the needle, the resin is prevented from running onto the top surface of the chip or hanging down from the end of the substrate, and the occurrence of variations in the finishing dimensions of the package or defects in the outer appearance of the package can be prevented.

It is preferable that when the resin is supplied onto the top surface including the contact portions of the guide plate and wiring substrate, the resin is supplied so as to adhere to one side face of the chip.

It is preferable that when the guide plate is separated from the wiring substrate, the guide plate or the wiring substrate is slid horizontally or vertically along their contact end, thereby separating one from the other.

It is preferable that a material that is more elastic than the wiring substrate, adheres well to the wiring substrate, and is lyophobic to the resin, is used as a material for the guide plate.

It is preferable that an insulating material for the wiring substrate is of the ceramic family or of the resin family, and silicon rubber is used for the guide plate.

Still another object of the present invention is to provide a method of manufacturing semiconductor devices which can realize, at a low cost with a high reliability, semiconductor devices with a single-sided resin sealed package structure where the distance between the chip outer edge and the substrate outer edge is very small, and which can make much smaller the single-sided resin-sealed package structure.

The foregoing object is accomplished by providing a first method of manufacturing semiconductor devices, comprising: the step of forming a circuit substrate where a plurality of wiring substrate areas are arranged in succession, each of the wiring substrate areas having the wiring containing a connection section on one major surface and an external connection terminal electrically connected to the connection section via a contact conducting layer and formed on the other major surface; the step of mounting on the wiring substrate areas a plurality of semiconductor chips having the electrode terminal sections corresponding to the connection sections of the wiring substrate areas, with the electrode terminal sections fixed and connected to the connection sections; the step of thereafter filling a sealing resin between the semiconductor chips and the wiring substrate areas on the circuit substrate; the step of hardening the filled sealing resin; and the step of thereafter dividing the circuit substrate into pieces according to the wiring substrate areas.

The foregoing object is also accomplished by a second method of manufacturing semiconductor devices, comprising: the step of forming a circuit substrate that contains a wiring substrate area having the wiring containing a connection section on one major surface and an external connection terminal electrically connected to the connection section via a contact conducting layer and formed on the other major surface, and a guide substrate area connected to the wiring substrate area; the step of positioning a semiconductor chip having an electrode terminal section corresponding to the connection section of the wiring substrate area so that the electrode terminal section of the semiconductor chip faces the connection section of the wiring substrate area and connecting the connection section to the electrode terminal section; the step of thereafter filling a sealing resin between the semiconductor chip and the wiring substrate area on the circuit substrate; the step of hardening the filled sealing resin; and the step of thereafter separating the wiring substrate area from the circuit substrate.

With the first method of manufacturing semiconductor devices, a circuit substrate where a plurality of wiring substrate areas are arranged in succession is formed, and semiconductor chips are each fixed and connected to the individual wiring substrate areas. Then, after sealing resin has been filled between the chip and the substrate and hardened, the circuit substrate is divided into pieces according to the wiring substrate areas. Thus, semiconductor devices with a single-sided resin-sealed package structure can be formed.

In this case, in the process of supplying the sealing resin, the area between chips on the circuit substrate has a distance twice the distance between the chip outer edge and the wiring substrate outer edge, so that the resin can be supplied smoothly.

In other words, even when the distance between the chip outer edge and the substrate outer edge after the chip has been separated from the circuit substrate is required to be very small, for example, a conventional dispenser and a needle whose diameter corresponds to the properties of the resin used can be used, and there is no possibility that the resin spewed from the needle will run onto the top surface of the chip or hang down from the end of the substrate, thus causing variations in the finishing dimensions of the package or defects in the outward appearance of the package. Because one supply of resin enables more than one chip to be sealed with resin simultaneously, it is possible to shorten the process time and reduce manufacturing costs.

Therefore, even when semiconductor devices having a single-sided resin-sealed package structure where the distance between the chip outer edge and the substrate outer edge is less than 1 mm to 0.5 mm are manufactured, it is possible to improve the yield and reliability of the products and reduce manufacturing costs.

It is preferable that the circuit substrate has notches made along the boundary lines of the individual wiring substrate areas in one side or both sided of the circuit substrate.

With the second method of manufacturing semiconductor devices, a circuit substrate where the wiring substrate area is connected to the guide substrate area is formed, and a semiconductor chip is fixed and connected to the wiring substrate area. Then, after a sealing resin has been filled between the chip and the substrate on the circuit substrate and hardened, the wiring substrate area is separated from the circuit substrate. Thus, semiconductor devices with a single-sided resin-sealed package structure can be formed.

In this case, in the process of supplying the sealing resin, the supply of resin from the guide substrate area enables the sealing resin to be filled, even if the chip is made smaller to the same size of that of the substrate. This helps make the package size much smaller.

It is preferable that the circuit substrate has the guide substrate area formed so as to connect to one side or each side of the wiring substrate area.

It is preferable that the circuit substrate has notches made along the boundary lines of the wiring substrate areas nd guide substrate areas in one side or both sided of the circuit substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1A and 1B schematically show a step of manufacturing a semiconductor device with a single-sided resin-sealed package structure according to an embodiment and a modification of the present invention, respectively;

FIGS. 2A and 2B schematically show a step of manufacturing a semiconductor device with a single-sided resin-sealed package structure according to further modifications of the embodiment of FIG. 1A;

FIGS. 3A and 3B are a perspective view and a sectional view of an example of the semiconductor device, respectively;

FIG. 8 show a step of manufacturing a semiconductor device with a single-sided resin-sealed package structure according to another modification of the embodiment of FIG. 7A;

FIG. 9 show a step of manufacturing a semiconductor device with a single-sided resin-sealed package structure according to a further modification of the embodiment of FIG. 7A;

FIGS. 10A and 10B are a perspective view and a sectional view of a device structure in a step of manufacturing a semiconductor device with a single-sided resin-sealed package structure according to still another embodiment of the present invention, respectively;

FIGS. 14A to 14D show modifications of FIG. 13B;

FIGS. 15A to 15C show modifications of cutting portions of the circuit substrate shown in FIGS. 10A and 13A;

FIG. 16 shows an example of the single-sided resin-sealed package structure disclosed in a prior Japanese Patent Application;

FIG. 17 shows another example of the single-sided resin-sealed package structure disclosed in another prior Japanese Patent Application.

DETAILED DESCRIPTION OF THE PREFERRED EMBODIMENTS

Figure 4:
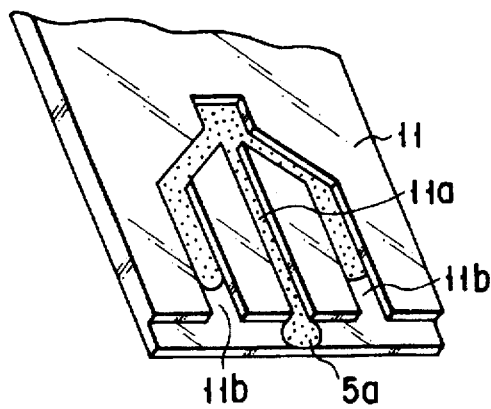
FIG. 4 shows an example of a guide plate.

Hereinafter, referring to the accompanying drawings, embodiments of the present invention will be described in detail.

FIGS. 1A and 1B and FIGS. 2A and 2B schematically show the steps of manufacturing a semiconductor device with a single-sided resin-sealed package structure according to an embodiment of the present invention, particularly the device structure and a guide plate 11 in the step of sealing with resin.

FIGS. 3A and 3B are a perspective view and a sectional view of an example of the finished semiconductor device.

The semiconductor device comprises a wiring substrate 1 having the wiring 1a containing a connection section 1b on one major surface, a semiconductor chip 2 mounted with the face down on one major surface of the substrate, a resin layer 5 filled and hardened between the chip and the substrate, an external connection terminal 4 formed on the other major surface of the substrate, and a contact conducting wiring 3 formed within a through-hole in the substrate 1 and connecting the wiring 1a to the external connection terminal 4.

An example of the steps all the way to bonding a bare chip 2 to the wiring substrate 1 will be described in brief.

A chip on whose element formation surface, a conductive material, for example, a bump electrode 2a (e.g., with a diameter of 100 μm and a height of 30 μm) made of metal is formed, is prepared as the bare semiconductor chip 2. The bump electrode 2a is a gold bump formed by, for example, electroplating, or a gold ball bump formed by ball bonding.

A substrate on whose one major surface, the wiring 1a containing the connection section 1b, a connection pad, is provided and on whose other major surface, the flat external connection terminal 4 is formed and is connected to the connection section 1b via the contact conducting wiring formed within the through-hole in the substrate, is prepared as the wiring substrate 1. More than one external connection terminal 4 are provided. They are arranged in, for example, a lattice, when the substrate 1 is viewed from above.

In the embodiment, in one major surface region of the substrate 1, the wiring 1a is embedded so as to be almost flush with the major surface (the bumps are less than ±10 μm in height).

When the connection section 1b—the connection pad—is formed on one major surface of the substrate 1, the substrate 1 having the wiring 1a on one major surface is fixed onto, for example, the stage of a screen printing machine with a vacuum absorption mechanism. In this state, a plane connection pad 1b (e.g., with a diameter of 150 μm and a height of 80 μm) is formed in the place corresponding to the metal bump electrode 2a of the chip on the substrate 1. Specifically, with a metal mask with an opening (e.g., 150 μm×150 μm) corresponding to the bump electrode 2a of the chip, the connection pad 1b is formed by screenprinting conductive paste, for example, silver paste (silver with a particle diameter of 1 μm and a viscosity of 100 ps) in the place corresponding to the metal bump electrode 2a of the chip on the substrate.

Next, by using a bonding unit with a mechanism that enables vacuum absorption of the chip 2, flip-chip bonding is effected to mount the chip 2 with the face down on the substrate 1. Specifically, the chip is arranged so that the corresponding bump electrode 2a faces the connection pad 1b on the substrate. In this state, the bonding head is pressed downward, or toward the substrate. This forces at least the tip portion of the bump electrode into the connection pad and fixes the connection pad and the bump electrode. In this state, by thermosetting silver paste for the connection pad 1b, the connection pad is joined to the bump electrode.

Then, with the chip flip-chip bonded to the substrate as described above, a resin layer 5 is formed. The resin layer 5 has the portion filled between the chip and the substrate (30 to 40 μm in the embodiment) and the portion that covers the peripheral side face of the chip so as to have an almost uniform fillet or external shape.

If the size of the substrate 1 is, for example, 15 mm in length and breadth and 0.2 mm in thickness, and the size of the chip 2 is, for example, 13 mm in length and breadth and 0.25 mm in thickness, the distance S3 between the chip outer edge and the substrate outer edge is very small at each side of the substrate (1 mm when the chip 2 is positioned in the center of the substrate 1). Since the width S3 of the resin spewed from the needle, or the width S3 of the allowable setting area of the needle is narrow, when resin is supplied from the needle onto the end of one side of the substrate 1, some device has to be thought out to prevent the resin from running onto the top surface of the chip or from hanging down from the end of the substrate.

To achieve this, the embodiment comprises the steps of using a guide plate 11 for pouring resin when resin is filled and bringing one end of the guide plate into contact with one end of the substrate 1 or a portion of the substrate 1 near one side of the chip 2 as shown in FIG. 1A or 1B, the step of inclining the guide plate 11 at a specific angle (e.g., 45 degrees) to the extension face of one major surface of the substrate 1 in the range from about 0 degree to about 90 degrees when or after one end of the guide plate 11 is brought into contact with the substrate 1, and the step of supplying resin 5a to part of the opening between the chip and the substrate by supplying the resin 5a from the needle to the top surface of the guide plate 11 and allowing the resin 5a to flow over the top surface of the guide plate 11.

The individual steps in the embodiment are automatically carried out using an existing automatic assembly apparatus for semiconductor devices and a newly produced special apparatus.

It is desirable that the guide plate 11 should have such a thickness (almost equal to or less than the thickness of the substrate, or about 0.1 mm) as enables one end to be in contact with a portion of the substrate near one side of the chip at the above angle.

If a hole is made in the guide plate in advance and resin is supplied from the needle 10 of the dispenser, with the needle passing through the hole from the reverse side of the guide plate as shown in FIG. 2A, when the resin 5a is supplied onto the top surface of the guide plate 11, the supplied resin can be separated easily from the needle, making it possible to supply a specific mount of resin.

For example, as shown in FIG. 4, a plurality of grooves 11a, 11b have been made in the top surface of the guide plate 11 so as to connect to the hole. In this case, it is desirable that the plurality of grooves should be made so that the paths of the grooves 11b on both sides through which resin flows toward the substrate may be longer than that of the groove 11a in the middle.

With these grooves, by allowing the resin supplied through the hole from the reverse side of the guide plate to flow along the inside of the grooves formed in the top surface of the guide plate when resin is poured over the top surface of the guide plate, it is possible to supply the resin almost uniformly to one side of the substrate on the contact side of the guide plate.

This makes it possible to supply the resin almost uniformly to the opening between the chip and the substrate at one side of the substrate on the contact side of the guide plate. By capillary action of the resin between the chip and the substrate, the resin can be allowed to flow almost uniformly into between the chip and the substrate and fill the gap.

If a temperature of, for example, 60° C. is applied to the resin filling section to promote the capillary action, the viscosity of the resin 5a will decrease, improving the speed at which the resin is poured into.

After the filling of the resin has been finished as described above, the guide plate 11 is separated from the substrate (e.g., it is separated upward almost at right angles to one major surface of the substrate). Thereafter, by heating and hardening the filled resin, the resin layer 5 is formed between the chip and the substrate, which completes a semiconductor device with a single-sided resin-sealed package structure.

When the resin is supplied onto the substrate by allowing the resin to flow along the top surface of the guide plate as described above, it is desirable that the guide plate 11 should be wider at the side in contact with the substrate than one side of the substrate with which the guide plate is in contact (e.g., the guide plate should have a width of 25 mm).

Furthermore, it is desirable that a material (e.g., silicon rubber) for the guide plate 11 should have the property of repelling resin to make the resin flow more easily.

As described earlier, when the resin is supplied onto the top surface of the guide plate 11, conditions under which the resin presents a suitable fluidity are set, or fluid resin is used.

It is desirable that the resin 5a should have the property of alleviating the degradation of the resin layer 5 formed between the chip and the substrate from the internal stress caused by the difference in material between the chip and the substrate (Young's modulus or thermal coefficient). Furthermore, it is desirable that the resin 5 should contain a filler whose diameter is equal to or less than the diameter (e.g., 25 μm or less) that can go into between the chip and the substrate in filling the resin between the chip and the substrate.

As described above, with the method in the embodiment, when resin is filled between the chip and the substrate, one end of the guide plate for pouring resin is brought into contact with a portion of one major surface of the substrate close to one side face of the chip. With the guide plate inclined at a specific angle to one major surface of the substrate, resin is supplied onto the top surface of the guide plate and allowed to flow over the top surface of the guide plate, thereby supplying the resin to the opening between the chip and the substrate.

This makes it possible to pour resin from over the guide plate onto the substrate and allow the resin to adhere to one side face of the chip near the center of the opening between the chip and the substrate, even if the distance S3 between the chip outer edge and the substrate outer edge is very small and the resin supplying space above one end of the substrate is narrow. After the resin has adhered to the side face of the chip, capillary action of resin begins. By the capillary action of resin between the chip and the substrate, it is possible to pour the resin into between the chip and the substrate and fill the resin between them.

Accordingly, with the method of the embodiment, even if the distance S3 between the chip outer edge and the substrate outer edge is very small, it is possible to use a conventional dispenser and a needle whose diameter corresponds to the properties of the resin used. Therefore, an almost constant amount of resin can be supplied stably and reliably, regardless of the diameter of the needle, preventing the resin from running onto the top surface of the chip or hanging down from the end of the substrate, with the result that it is possible to prevent the occurrence of variations in the finishing dimensions of the package or defects in the outward appearance of the package. This makes it possible to improve the yield of semiconductor devices and reduce manufacturing costs.

Figure 5A:
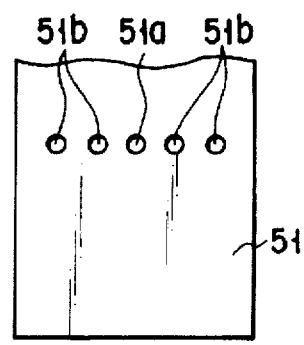
FIGS. 5A and 5B show modifications of the guide plate of FIG. 4.
Figure 5B:
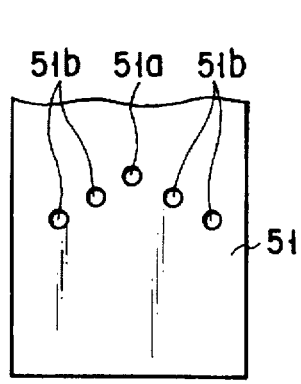
Figure 6A:
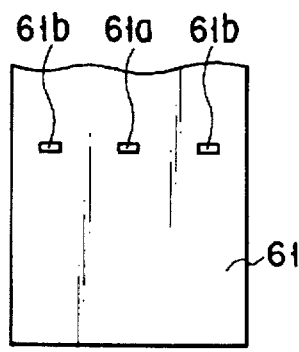
FIGS. 6A and 6B show further modifications of the guide plate of FIG. 4.
Figure 6B:
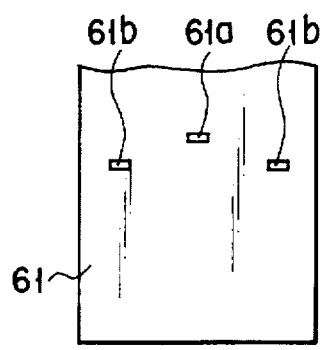

For example, a guide plate 51 in which a plurality of round holes 51a, 51b, are made in a line as shown in FIG. 5A, or a guide plate 61 in which a plurality of rectangular holes 61a, 61b are made in a line as shown in FIG. 6A may be used in place of the guide plate with a plurality of grooves as shown in the embodiment. In this case, as many needles as there are holes are used and supply resin through the holes onto of the surface of the substrate. Those holes may be positioned so that the path from the hole 51a in the middle through which resin flows toward the substrate may be longer than the paths from the holes 61b on both sides as shown in FIG. 5B, or the path from the hole 61a in the middle may be longer than the paths from the holes 61b as shown in FIG. 6B.

In the embodiment, when the resin is supplied from the needle onto the top surface of the guide plate, a constant amount of resin is supplied through a hole in the guide plate from the reverse side of the guide plate. The present invention is not limited to this. For instance, by supplying resin from a dispenser above the guide plate as shown in FIG. 2B when resin is supplied onto the top surface of the guide plate, it is possible to supply an almost constant amount of resin stably by one supply of resin.

Also in the embodiment, when resin is supplied, a single guide plate is brought into contact with one side of the substrate near one side of the chip in an inclined state and the resin is supplied onto only the one side of the substrate. Additionally, two guide plates may be used and brought into contact with two sides of the substrate near two opposite sides of the chip in an inclined state. In this state, the resin may be supplied onto the two sides of the substrate. Furthermore, four guide plates may be brought into contact with the four sides of the substrate near the four sides of the chip in an inclined state. In this state, the resin may be supplied onto the four sides of the substrate.

When the resin filled between the chip and the substrate is hardened, it is desirable that the resin should be hardened while a load is being applied to the chip and the substrate to prevent the misalignment of the bump electrodes of the chip with the connection pad of the substrate.

Use of a substrate that has a flat-type wiring pattern formed in the peripheral edge portion on its one major surface prevents cracks or warps in the wiring pattern from taking place, because of reinforcing action of the flat-type wiring pattern during the flip-chip bonding. This improves not only the yield of finished products but also the immunity to noise when a finished product is built in a memory card. Furthermore, the bump electrodes may be formed on the substrate side, not on the chip side.

The shape of the substrate and the chip is not restricted to a square, but may be a rectangle. The substrate is not limited to the alumina family and aluminum nitride family, but may be the resin family (e.g., a BT resin substrate). Furthermore, the substrate is not limited to a substrate that has the wiring and external connection terminals embedded in the substrate so as to be flush with its surface (e.g., a substrate formed on an insulating base of the alumina family by green-sheet techniques or a substrate formed on an insulating base of the resin family by prepreg techniques), as shown in FIG. 17, but may be a substrate that has the wiring and external connection terminals formed so as to protrude from the substrate, as shown in FIG. 16. Additionally, the substrate may be a substrate that has the upper layer wiring and the lower layer wiring electrically connected to each other via blind bare holes or a substrate with a multilayer wiring structure.

The present embodiment is not restricted to the method of forcing at least the tips of the bump electrodes into the connection pad as described in the embodiment, when the chip is joined onto the substrate by flip-chip bonding. For instance, a gold connection pad may be joined to the gold bump electrodes by causing solid-state diffusion between the pad and the electrodes, as disclosed in detail in Japanese Patent Application No. 6-50757.

As described above, according to the embodiment and modification described in reference to FIGS. 1A to 6B, there is provided a method of manufacturing semiconductor devices which, when resin is filled between a chip and a substrate to manufacture a semiconductor device with a single-sided resin-sealed package structure, can prevent the occurrence of variations in the finishing dimensions of the package or defects in the outward appearance of the package, even if the distance between the chip outer edge and the substrate outer edge is very small, and which can make smaller the single-sided resin-sealed package structure.

Figure 7A:
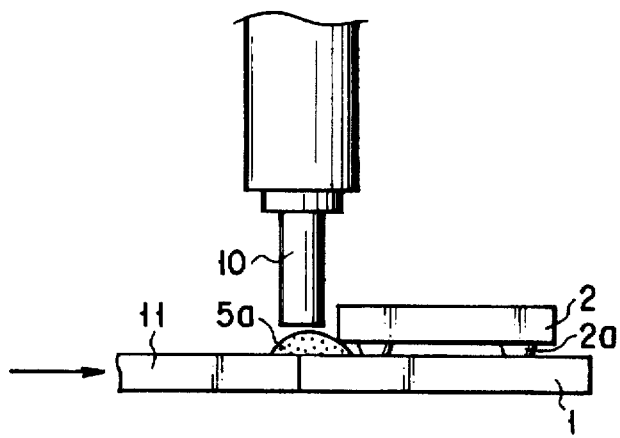
FIGS. 7A and 7B schematically show a step of manufacturing a semiconductor device with a single-sided resin-sealed package structure according to another embodiment and a modification of the present invention, respectively.
Figure 7B:
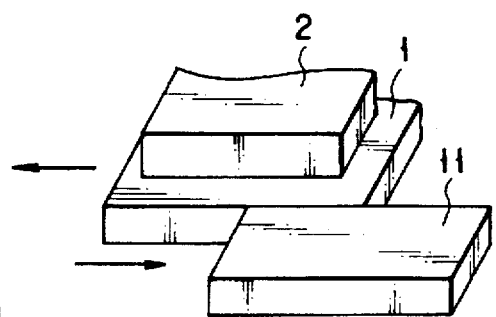

Another embodiment shown in FIGS. 7A and 7B comprises the steps of using a guide plate 11 for helping supply resin when resin 5a is supplied and bringing one end of the guide plate into contact with one end of a substrate 1 so as to be almost flush with one major surface of the substrate, the step of thereafter supplying the resin to the opening between a chip and the substrate by supplying the resin 5a onto the surface including the contact portions of the guide plate and the substrate, and the step of thereafter separating the guide plate from the substrate.

The individual steps in the embodiment are automatically carried out using an existing automatic assembly apparatus for semiconductor devices and a newly produced special apparatus.

When the resin is supplied onto the surface including the contact portions of the guide plate and the substrate, only one supply of resin along the contact portions of the guide plate and substrate in a line from the needle 10 of a conventional dispenser makes it possible to supply an almost constant amount of resin stably. In this case, it is desirable that the resin should adhere to the opening between the chip and the substrate at one side of the substrate on the contact side of the guide plate and should be supplied almost uniformly to the opening between the chip and the substrate. This causes capillary action of the resin, making it possible to pour the resin uniformly into the entire gap between the chip and the substrate and fill the resin into the gap. At this time, if a temperature of, for example, 60° C. is applied to the resin filling section to promote the capillary action, the viscosity of the resin 5a will decrease, improving the speed at which the resin is poured into.

It is desirable that a material for the guide plate should be more elastic than the substrate and adhere well to the substrate in order that the resin will not flow into the contact portions of the guide plate and the wiring substrate, or that the resin will not hang down to one end of the substrate at the contact portion.

When one end of the guide plate is brought into close contact with one end of the substrate, it is desirable that the adhesion should be maintained by continuing to apply pressure laterally as shown by the arrow in FIG. 7A.

Furthermore, it is desirable that a material for the guide plate should have the property of repelling (be lyophobic to) resin to make the resin on the guide plate move more easily onto the substrate.

When the guide plate is separated from the substrate, it is desirable that the guide plate 11 and/or the substrate 1 should be separated from each other by sliding one horizontally along the contact end (in the longitudinal direction of the contact end) as shown by the arrow in FIG. 7B. This makes it possible to wipe off the resin even if the resin adheres to one end of the wiring substrate.

When the guide plate is separated from the substrate, the guide plate 11 and/or the substrate 1 may be separated from each other, as shown in FIG. 8 by sliding one vertically along the contact end (along the short side of the contact end).

As described above, it is desirable that a material for the guide plate 11 should be more elastic than the substrate, adhere well to the substrate, and be lyophobic to resin (e.g., silicon rubber when the insulating material for the substrate is of the ceramic family or resin family).

When one end of the guide plate is brought into close contact with one end of the substrate so that the top surface is almost flush with one major surface of the substrate, it is desirable that the thickness of the guide plate should be almost equal to the thickness of the substrate in order to improve workability by arranging the guide plate and the substrate side by side on a pedestal of the same horizontal surface.

After the filling of the resin has finished and the guide plate has been separated from the substrate, a resin layer is formed between the chip and the substrate by heating and hardening the filled resin, which completes a semiconductor device with a single-sided resin-sealed package structure.

When the resin is supplied as described above, it is desirable that the width of the guide plate on the contact end side should be greater than one side of the substrate on the contact end side (e.g., the guide plate should have a width of 25 mm).

As described earlier, when the resin is supplied, conditions under which the resin presents a suitable fluidity are set, or fluid resin is used.

It is desirable that the resin should have the property of alleviating the degradation of the resin layer formed between the chip and the substrate from the internal stress caused by the difference in material between the chip and the substrate (Young's modulus or thermal coefficient). Furthermore, it is desirable that the resin should contain a filler whose diameter is equal to or less than the diameter (e.g., 25 μm or less) that can go into between the chip and the substrate in filling the resin between the chip and the substrate.

As described above, with the method in the embodiment described in reference to FIGS. 7A, 7B and 8, when resin is filled between the chip and the substrate, one end of the guide plate is brought into close contact with at least one major surface of the substrate so that the top surface of the guide plate is almost flush with one major surface of the substrate. Then, after the resin has been supplied onto the surface including the contact portions of the guide plate and the substrate, the guide plate is separated from the substrate.

This makes it possible to pour the resin on the guide plate onto one end of the substrate and allow the resin to adhere to one side face of the chip near the center of the opening between the chip and the substrate, even if the distance S3 between the chip outer edge and the substrate outer edge is very small and the resin supplying space above one end of the substrate is narrow. After the resin has adhered to the side face of the chip, capillary action of resin begins. By the capillary action of resin between the chip and the substrate, it is possible to pour the resin into between the chip and the substrate and fill the resin between them.

Accordingly, with the method of the embodiment, even if the distance S3 between the chip outer edge and the substrate outer edge is very small, it is possible to use a conventional dispenser and a needle whose diameter corresponds to the properties of the resin used to supply an almost constant amount of resin stably and reliably, regardless of the diameter of the needle. Therefore, this prevents the resin from running onto the top surface of the chip or hanging down from the end of the substrate, with the result that it is possible to prevent the occurrence of variations in the finishing dimensions of the package or defects in the outward appearance of the package. This makes it possible to improve the yield of semiconductor devices and reduce manufacturing costs.

In place of the guide plate 11 shown in the embodiment of FIGS. 7A, 7B and 8, a guide plate 12 at one end of which a brim-like thin protrusion 12a is formed so as to be flush with the surface as shown in FIG. 9 may be used to supply resin onto the protrusion and the adjacent surface of the substrate, with the protrusion placed on the top surface of one end of the substrate.

In the embodiment, when resin is supplied, a single guide plate is brought into close contact with one of the four sides of the substrate and the resin is supplied onto only the one side of the substrate. Additionally, two guide plates may be used and brought into close contact with two opposite sides of the substrate. In this state, the resin may be supplied onto the two sides of the substrate. Furthermore, four guide plates may be brought into close contact with the four sides of the substrate. In this state, the resin may be supplied onto the four sides of the substrate.

When the resin filled between the chip and the substrate is hardened, it is desirable that the resin should be hardened while a load is being applied to the chip and the substrate to prevent the misalignment of the bump electrodes of the chip with the connection pad of the substrate.

Use of a substrate that has a flat-type wiring pattern formed in the peripheral edge portion on its one major surface prevents cracks or warps in the wiring pattern from taking place, because of reinforcing action of the flat-type wiring pattern during the flip-chip bonding. This improves not only the yield of finished products but also the immunity to noise when a finished product is built in a memory card. Furthermore, the bump electrodes may be formed on the substrate side, not on the chip side.

The shape of the substrate and the chip is not restricted to a square, but may be a rectangle. The substrate is not limited to the alumina family and aluminum nitride family, but may be the resin family (e.g., a BT resin substrate). Furthermore, the substrate is not limited to a substrate that has the wiring and external connection terminals embedded in the substrate so as to be flush with its surface (e.g., a substrate formed on an insulating base of the alumina family by green-sheet techniques or a substrate formed on an insulating base of the resin family by prepreg techniques), as shown in FIG. 17, but may be a substrate that has the wiring and external connection terminals formed so as to protrude from the substrate, as shown in FIG. 16. Additionally, the substrate may be a substrate that has the upper layer wiring and the lower layer wiring electrically connected to each other via blind bare holes or a substrate with a multilayer wiring structure.

The present embodiment is not restricted to the method of forcing at least the tips of the bump electrodes into the connection pad as described in the embodiment, when the chip is joined onto the substrate by flip-chip bonding. For instance, a gold connection pad may be joined to the gold bump electrodes by causing solid-state diffusion between the pad and the electrodes, as disclosed in detail in Japanese Patent Application No. 6-50757.

Hereinafter, a further embodiment of the present invention will be explained in detail with reference to the accompanying drawings.

FIGS. 10A and 10B are a sectional view and a plan view of a device structure in a step in manufacturing semiconductor devices with a single-sided resin-sealed package structure according to a further embodiment of the present invention.

First, a circuit substrate 20 and a plurality of semiconductor chips 2 are prepared.

The circuit substrate 20 is formed so as to contain a plurality of wiring substrate areas 1 (e.g., a total of four areas, two in length and two in breadth). Each of the wiring substrate areas 1 has the wiring 1a on one major surface, the wiring including a connection section 1b—a connection pad—and a flat-type external connection terminal 4 formed on the other major surface, the terminal being connected to the connection section 1b via a contact conducting wiring 3 formed inside a through-hole in the substrate 1. A plurality of external connection terminals 4 are provided and arranged in, for example, a lattice when the substrate 1 is viewed from above.

In the embodiment, the wiring 1a and external connection terminal 4 in the wiring substrate area 1 project a little (e.g., about 35 µm) from the surface of the substrate. The circuit substrate 10 is, for example, 40 mm long, 20 mm wide, and 0.2 mm thick. Each wiring area is 20 mm long and 10 mm wide in the embodiment.

When the connection section 1b—the connection pad-is formed on one major surface of the wiring substrate area 1, the circuit substrate 10 is fixed onto, for example, the stage of a screen printing machine with a vacuum absorption mechanism. In this state, a plane connection pad 1b (e.g., with a diameter of 150 µm and a height of 80 µm) is formed in the place corresponding to the metal bump electrode 2a of the chip on one major surface of the wiring substrate area 1. Specifically, with a metal mask with an opening (e.g., 150 µm×150 µm) corresponding to the bump electrode 2a of the chip, the connection pad 1b is formed by screen-printing conductive paste, for example, silver paste (silver with a particle diameter of 1 µm and a viscosity of 100 ps) in the place corresponding to the metal bump electrode 2a of the chip on the wiring substrate area 1.

Each chip 2 is formed by usual manufacturing processes. On the external connection pad on the element formation face of each chip, a conductive substance, for example, a metal bump electrode (e.g., with a diameter of 100 µm and a height of 30 µm) 2a is formed. The bump electrode 2a is a gold bump formed by, for example, electroplating, or a gold ball bump formed by ball bonding. The size of the chip 2 is, for example, 15 mm long, 5 mm wide, and 0.25 mm thick.

By using a bonding machine with a mechanism for effecting vacuum absorption of the chip 2 and a circuit substrate driving machine with a mechanism for moving the circuit substrate 10 horizontally step by step, flip-chip bonding is effected to mount the chips 2 with the face down on the wiring substrate areas 1.

Specifically, the chips 2 are forced to face the corresponding wiring substrate areas 1 so that the corresponding bump electrodes 2a of the chips faces the connection sections 1b on the wiring substrate areas 1. In this state, the bonding head is pressed downward. This forces at least the tip portions of the bump electrodes into the connection pads 1b and fixes the connection pads 1b and the bump electrodes 2a. In this state, by thermosetting silver paste for the connection pads 1b, the connection pads are joined to the bump electrodes 2a.

Then, after sealing resin has been filled between the chip 2 and the substrate, a resin layer 5 is formed by, for example, thermally hardening the resin. When the resin filled between the chip and the substrate is hardened, it is desirable that the resin should be hardened while a load is being applied to the chip and the substrate to prevent the misalignment of the bump electrodes of the chip with the connection pad of the substrate.

Thereafter, the circuit substrate 20 is cut into pieces by, for example, a dicing machine along the boundary lines 21 between the wiring substrate areas. This dicing action produces four semiconductor devices with a single-sided resin-sealed package structure almost at the same time.

Figure 11:
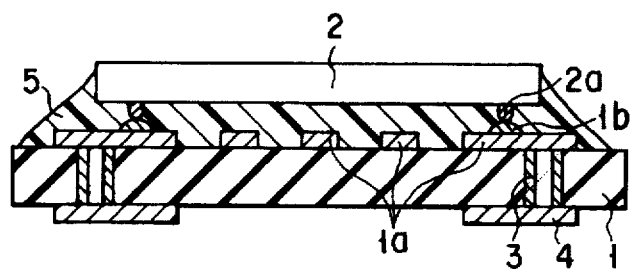
FIG. 11 shows a semiconductor device with a single-sided resin-sealed package structure formed by the steps of FIGS. 10A and 10B.

A semiconductor device with a single-sided resin-sealed package structure formed through the above processes described in reference to FIGS. 10A and 10B is shown in FIG. 11.

The semiconductor device shown in FIG. 11 comprises a wiring substrate 1 having the wiring 1a containing a connection section 1b on one major surface of the substrate, a semiconductor chip 2 electrically connected to the connection section 1b and mounted with the face down on one major surface of the substrate, a resin layer 5 hardened with the resin filled between the chip and the substrate, and an external connection terminal 4 formed on the other major surface of the substrate and electrically connected to the connection section 1b via a contact conducting layer. In the embodiment, the distance between the chip outer edge and the substrate outer edge is 2.5 mm at each side of the wiring substrate 1.

In the semiconductor device, the resin layer 5 to fix the chip and substrate is not only filled between the chip and the substrate, but also formed so as to cover the outer side faces of the chip. Therefore, the chip is firmly secured to the substrate and they are protected from both the internal stress caused by heat and physical stress. As a result, the chip is less liable to be affected by the external environment and impact, which improves the reliability of the semiconductor device.

To form the resin layer 5, the circuit substrate 10 with the chip bonded is placed on the work and a constant amount of resin is supplied to the area 22 between two chips on the circuit substrate 10 by using a conventional dispenser or another suitable method. In this case, it is desirable that resin should be supplied so as to adhere to the opening between the chip and the substrate. This allows capillary action of resin to begin. The capillary action of resin between the chip and the substrate (the distance between them is 30 to 40 μm in the embodiment) allows the resin to be filled almost uniformly between the chip and the substrate and go around the outer side faces of the chip. As a result, the resin layer 5 is not only filled between the chip and the substrate, but also covers part of the outer side faces of the chip.

In the resin supplying process, conditions under which the resin presents a suitable fluidity are set, or fluid resin, such as epoxy resin with a low viscosity, is used. To promote the capillary action, temperatures ranging from, for example, 60° C. to 80° C. is applied to the resin filled portion to reduce the viscosity of the resin, improving the speed at which the resin is poured. Furthermore, it is desirable that the resin should have the property of alleviating the degradation of the resin layer 5 formed between the chip and the substrate from the internal stress caused by the difference in material between the chip and the substrate (Young's modulus or thermal coefficient). Furthermore, it is desirable that the resin should contain a filler whose diameter is equal to or less than the diameter (e.g., 25 μm or less) that can go into between the chip and the substrate in filling the resin between the chip and the substrate.

The individual steps are automatically carried out using an existing automatic assembly apparatus for semiconductor devices and a newly produced special apparatus.

Specifically, with the method in the embodiment described in reference to FIGS. 10A, 10B and 11, a circuit substrate where a plurality of wiring substrate areas are arranged in succession is formed and chips are each fixed and connected to the individual wiring substrate areas. Then, after sealing resin has been filled between the chip and the substrate on the circuit substrate and then hardened, the circuit substrate is divided into pieces according to the wiring substrate areas, which produces semiconductor devices with a single-sided resin-sealed package structure.

In the process of supplying the sealing resin, because the area between chip areas on the circuit substrate is twice the distance between the chip outer edge and the wiring substrate area outer edge, the resin can be supplied smoothly. In other words, in a case where the distance between the chip outer edge and the substrate outer edge after the chips have been cut off from the circuit substrate is required to be very small (e.g., less than 1 mm to 0.5 mm), even use of a conventional dispenser and a needle whose diameter corresponds to the properties of the resin used prevents the resin spewed from the needle from running onto the top surface of the chip or hanging down from the end of the substrate, which eliminates the danger of causing variations in the finishing dimensions of the package or defects in the outward appearance of the package. Furthermore, because one supply of resin enables four chips to be sealed with resin at the same time, it is possible to shorten the processing time and reduce manufacturing costs.

Therefore, with the method of the embodiment described in reference to FIGS. 10A, 10B and 11, even when semiconductor devices with a single-sided resin-sealed package structure where the distance between the chip outer edge and the substrate outer edge is very small, are manufactured, it is possible to improve the yield and reliability of products and reducing manufacturing costs.

When resin is supplied onto each side of the circuit substrate 10, the needle may be positioned above each side of the substrate one after another by rotating the work or moving the resin supplying needle, and only an almost constant amount of resin be supplied, for example, in a line onto the end of each side. Alternatively, a needle having a plurality of openings corresponding to each side of the substrate may be used and the openings be forced to face the corresponding sides of the substrate to supply resin at the same time.

Use of a substrate that has a flat-type wiring pattern formed at the peripheral edge portion prevents cracks or warps in the wiring pattern from taking place, because of reinforcing action of the flat-type wiring pattern during the flip-chip bonding. This improves not only the yield of finished products but also the immunity to noise when the finished product is built in a memory card. Furthermore, the bump electrodes may be formed on the substrate side, not on the chip side.

Figure 12A:
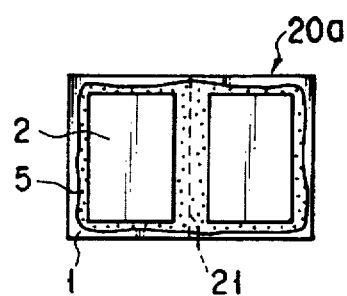
FIGS. 12A to 12D show device structures in a step of manufacturing semiconductor devices with a single-sided resin-sealed package structure according to modifications of FIG. 10B.
Figure 12B:
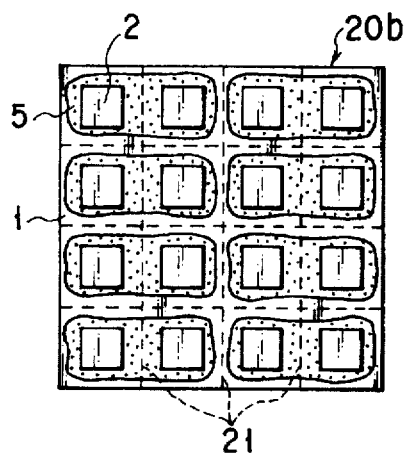
Figure 12C:
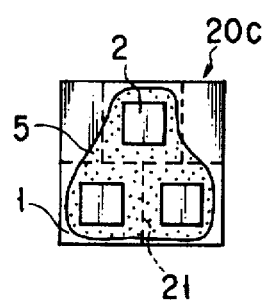
Figure 12D:
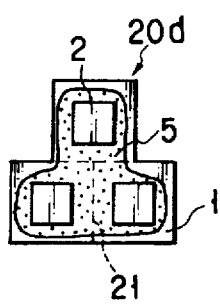

In the embodiment of FIGS. 10A, 10B and 11, the circuit substrate 10 is such that four wiring substrate areas 1 are arranged in succession, two in length and two in breadth. In addition, as shown in FIG. 12A, a circuit substrate 20a where two wiring substrate areas 1 are arranged in succession may be formed. As shown in FIG. 12B, a circuit substrate 20b where 16 wiring substrate areas 1 are arranged side by side, four in length and four in breadth may be formed. As shown in FIGS. 12C and 12D, a square circuit substrate 20c or a convex circuit substrate 20d where three wiring substrate areas are arranged in a convex may be formed. Then, chips may be bonded to the individual wiring substrate areas.

Figure 13A:
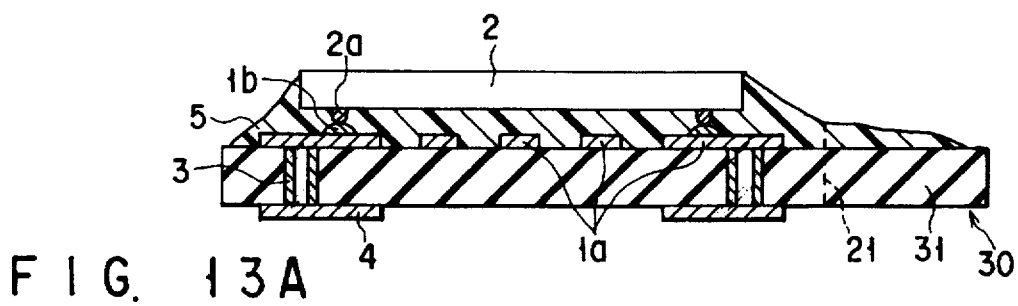
FIGS. 13A and 13B are a perspective view and a sectional view of a device structure in a step of manufacturing a semiconductor device with a single-sided resin-sealed package structure according to a further embodiment of the present invention, respectively.
Figure 13B:
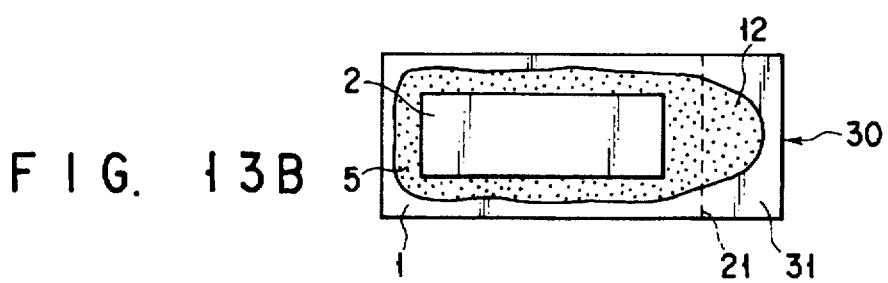
Figure 18A:
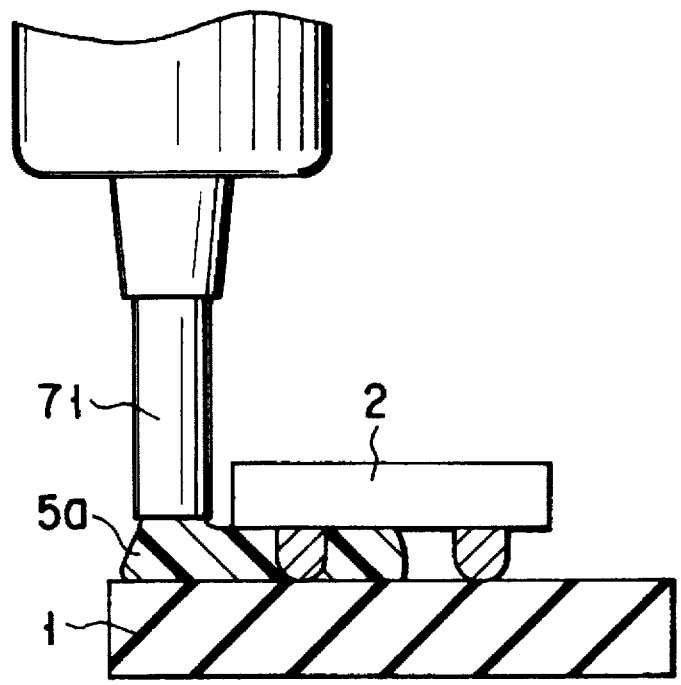
FIGS. 18A and 18B show steps of forming a resin layer of the single-sided resin-sealed package structure shown in FIGS. 16 and 17.
Figure 18B:
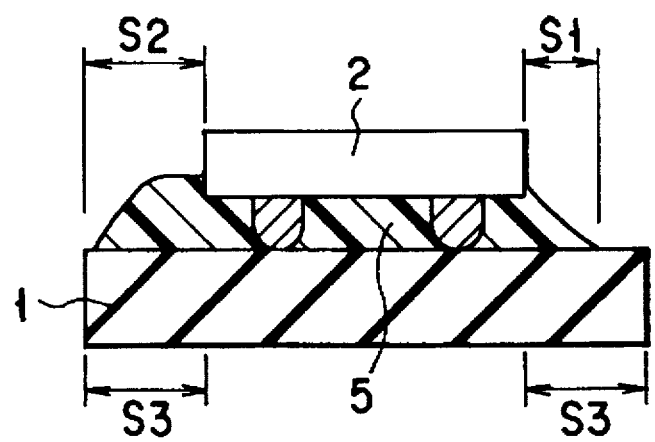

FIGS. 13A and 13B are a sectional view and a plan view of a device structure in a step in manufacturing semiconductor devices having a single-sided resin-sealed package structure according to still another embodiment of the present invention.

This embodiment differs from the preceding embodiment in that the circuit substrate 30 has a single wiring substrate area 1 as described earlier and a guide substrate area 21 connected to, for example, one side of the area 1. In the other respects, the embodiment is the same as the preceding embodiment. Specifically, the electrode terminal section of the chip 2 is positioned so as to face the connection section of the wiring substrate area 1 and then the electrode terminal section is fixed and connected to the connection section. Then, after resin has been supplied to, for example, the area 12 including the boundary lines 11 to fill the sealing resin between the chip and the substrate, the wiring substrate areas are cut off from the circuit substrate with a dicer.

The present embodiment not only produces the same effect as the preceding embodiment, but also makes it possible to render the package size much smaller, because the sealing resin can be supplied onto the guide substrate area 21 and filled, even if the chip is made smaller to the same size as that of the wiring substrate.

The circuit substrate 30 may have a guide substrate area connected to a portion other than one side of the wiring substrate area. For instance, the circuit substrate may be a circuit substrate 30a that has guide substrate areas 31 connected in an L-shape to two sides of the wiring substrate area 1 crossing each other at right angles as shown in FIG. 14A, a circuit substrate 30b that has guide substrate areas 31 connected to each side of the wiring substrate area 1 as shown in FIG. 14B, a circuit substrate 30c that has a guide substrate area 31 connected to part of one side of the wiring substrate area 1 as shown in FIG. 14C, or a circuit substrate 30d that has a guide substrate area 31 connected to any part (e.g., one corner) of the periphery of the wiring substrate area as shown in FIG. 14D.

In the embodiment, the circuit substrate is cut off with a dicer. Alternatively, as shown in FIGS. 15A to 15C, notches 32 may be made in one side or both sides of the circuit substrate along the cut-off area (the boundary lines 21 between wiring substrate areas or the boundary lines 21 between the wiring substrate areas and the guide substrate areas) of the circuit substrate (20 as a representative) and the circuit substrate be folded along the notches 32 after resin sealing and divided into chips.

In the embodiments, the substrate and chip are not limited to a rectangle, but may be a square. The material for the substrate is not restricted to the alumina family and aluminum nitride family, but may be of the glass/epoxy family. Furthermore, the substrate is not limited to a substrate formed so that the wiring and external connection terminal may project from the substrate as shown in FIGS. 11 and 13A. For instance, as shown in FIG. 17, it may be a substrate where the wiring and external connection terminal are embedded so as to be almost flush with the substrate (e.g., a substrate formed on an insulating base of the alumina family by green-sheet techniques or a substrate formed on an insulating base of the resin family by prepreg techniques). Additionally, the substrate may be a substrate that has the upper layer wiring and the lower layer wiring electrically connected to each other via a contact conducting layer formed in a blind bare hole or a substrate with a multilayer wiring structure.

The present invention is not restricted to the method of forcing at least the tips of the bump electrodes into the connection pad as described in the embodiment, when the chip is joined onto the substrate by flip-chip bonding. For instance, a gold connection pad may be joined to the gold bump electrodes by causing solid-state diffusion between the pad and the electrodes, as disclosed in detail in Japanese Patent Application No. 6-50757.

As described above, with the semiconductor device according to the invention, it is possible to provide a method of manufacturing semiconductor devices which realizes, at low cost with high reliability, semiconductor devices with a single-sided resin-sealed package structure where the distance between the chip outer edge and the substrate outer edge is very small, and which makes the single-sided resin-sealed package structure much smaller.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing semiconductor devices, comprising:

the step of positioning a semiconductor chip so that a connection section of a wiring substrate having the wiring containing the connection section on one major surface and an external connection terminal connected to the wiring via a contact contacting layer and formed on the other major surface faces an electrode terminal section of the corresponding semiconductor chip;

the step of connecting the connection section of the wiring substrate to the electrode terminal section of the corresponding semiconductor chip;

the step of thereafter filling a sealing resin between the semiconductor chip and the wiring substrate; and the step of hardening the filled sealing resin; and further comprising:

the step of, when the sealing resin is filled, using a guide plate for pouring resin and bringing one end of the guide plate into contact with one face end of the wiring substrate or with a portion of one major surface near at least one side face of the chip;

the step of inclining the guide plate so that the guide plate may cross one major surface of the wiring substrate at a specified angle, when or after one end of the guide plate is brought into contact with the wiring substrate;

the step of thereafter supplying resin onto the top surface of the guide plate and allowing the resin to flow over the top surface of the guide plate, thereby supplying the resin to an opening between the chip and the substrate; and the step of thereafter separating the guide plate from the wiring substrate.

2. A method of manufacturing semiconductor devices, according to claim 1, wherein when the resin is supplied onto the top surface of the guide plate, a hole is made in the guide plate in advance, a plurality of grooves are made in the top surface of the guide plate so as to connect to the hole, an almost constant amount of resin is supplied through the hole from the reverse side of the guide plate, and the resin supplied through the hole is allowed to flow through the plurality of grooves.

3. A method of manufacturing semiconductor devices according to claim 2, wherein the plurality of grooves are formed so that those on both sides may have the longer paths along which the resin flows toward the wiring substrate than the groove in the middle.

4. A method of manufacturing semiconductor devices according to claim 1, wherein when the resin is supplied onto the top surface of the guide plate, a plurality of holes are made in the guide plate in advance, and an almost constant amount of resin is supplied through the plurality of holes from the reverse side of the guide plate.

5. A method of manufacturing semiconductor devices according to claim 4, wherein the positions and shapes of the plurality of holes are determined so that those on both sides may have the longer paths along which the resin flows toward the wiring substrate than the hole in the middle.

6. A method of manufacturing semiconductor devices, comprising:

the step of positioning a semiconductor chip so that a connection section of a wiring substrate having the wiring containing the connection section on one major surface and an external connection terminal connected to the wiring via a contact conducting layer and formed on the other major surface faces an electrode terminal section of the corresponding semiconductor chip;

the step of connecting the connection section of the wiring substrate to the electrode terminal section of the corresponding semiconductor chip;

the step of thereafter filling a sealing resin between the semiconductor chip and the wiring substrate; and the step of hardening the filled sealing resin; and further comprising:

the step of, when the sealing resin is filled, using a guide plate for helping supply resin and bringing one end of the guide plate into close contact with at least one end of the wiring substrate so that the top surface of the guide plate is almost flush with one major surface of the wiring substrate;

the step of thereafter supplying resin onto the top surface including the contact portions of the guide plate and wiring substrate and thereby supplying the resin to an opening between the chip and the substrate; and the step of thereafter separating the guide plate from the wiring substrate.

7. A method of manufacturing semiconductor devices according to claim 6, wherein when the resin is supplied onto the top surface including the contact portions of the guide plate and wiring substrate, the resin is supplied so as to adhere to one side face of the chip.

8. A method of manufacturing semiconductor devices according to claim 6, wherein when the guide plate is separated from the wiring substrate, the guide plate or the wiring substrate is slid horizontally or vertically along their contact end, thereby separating one from the other.

9. A method of manufacturing semiconductor devices according to claim 7, wherein when the guide plate is separated from the wiring substrate, the guide plate or the wiring substrate is slid horizontally or vertically along their contact end, thereby separating one from the other.

10. A method of manufacturing semiconductor devices according to claim 6, wherein a material that is more elastic than the wiring substrate, adheres well to the wiring substrate, and is lyophobic to the resin, is used as a material for the guide plate.

11. A method of manufacturing semiconductor devices according to claim 7, wherein a material that is more elastic than the wiring substrate, adheres well to the wiring substrate, and is lyophobic to the resin, is used as a material for the guide plate.

12. A method of manufacturing semiconductor devices according to claim 8, wherein a material that is more elastic than the wiring substrate, adheres well to the wiring substrate, and is lyophobic to the resin, is used as a material for the guide plate.

13. A method of manufacturing semiconductor devices according to claim 9, wherein a material that is more elastic than the wiring substrate, adheres well to the wiring substrate, and is lyophobic to the resin, is used as a material for the guide plate.

14. A method of manufacturing semiconductor devices according to claim 10, wherein an insulating material for the wiring substrate is of the ceramic family or of the resin family, and silicon rubber is used for the guide plate.

15. A method of manufacturing semiconductor devices according to claim 11, wherein an insulating material for the wiring substrate is of the ceramic family or of the resin family, and silicon rubber is used for the guide plate.

16. A method of manufacturing semiconductor devices according to claim 12, wherein an insulating material for the wiring substrate is of the ceramic family or of the resin family, and silicon rubber is used for the guide plate.

17. A method of manufacturing semiconductor devices according to claim 13, wherein an insulating material for the wiring substrate is of the ceramic family or of the resin family, and silicon rubber is used for the guide plate.

18. A method of manufacturing semiconductor devices, comprising:

the step of forming a circuit substrate where a plurality of wiring substrate areas are arranged in succession, each of the wiring substrate areas having the wiring containing a connection section on one major surface and an external connection terminal electrically connected to the connection section via a contact conducting layer and formed on the other major surface;

the step of mounting on the wiring substrate areas a plurality of semiconductor chips having the electrode terminal sections corresponding to the connection sections of the wiring substrate areas, with the electrode terminal sections fixed and connected to the connection sections;

the step of thereafter filling a sealing resin between the semiconductor chips and the wiring substrate areas on the circuit substrate;

the step of hardening the filled sealing resin; and the step of thereafter dividing the circuit substrate into pieces according to the wiring substrate areas.

19. A method of manufacturing semiconductor devices according to claim 18, wherein the circuit substrate has notches made along the boundary lines of the individual wiring substrate areas in one side or both sided of the circuit substrate.

20. A method of manufacturing semiconductor devices, comprising:

the step of forming a circuit substrate that contains a wiring substrate area having the wiring containing a connection section on one major surface and an external connection terminal electrically connected to the connection section via a contact conducting layer and formed on the other major surface, and a guide substrate area connected to the wiring substrate area;

the step of positioning a semiconductor chip having an electrode terminal section corresponding to the connection section of the wiring substrate area so that the electrode terminal section of the semiconductor chip faces the connection section of the wiring substrate area and connecting the connection section to the electrode terminal section;

the step of thereafter filling a sealing resin between the semiconductor chip and the wiring substrate area on the circuit substrate;

the step of hardening the filled sealing resin; and the step of thereafter separating the wiring substrate area from the circuit substrate.

21. A method of manufacturing semiconductor devices according to claim 20, wherein the circuit substrate has the guide substrate area formed so as to connect to one side or each side of the wiring substrate area.

22. A method of manufacturing semiconductor devices according to claim 20, wherein the circuit substrate has notches made along the boundary lines of the wiring substrate areas and guide substrate areas in one side or both sided of the circuit substrate.

* * * * *